(12) United States Patent
Chiang et al.

(10) Patent No.: US 8,050,379 B2
(45) Date of Patent: Nov. 1, 2011

(54) SHIFT REGISTER WITH LOWER POWER CONSUMPTION AND LIQUID CRYSTAL DISPLAY USING THE SAME

(75) Inventors: Chien-Hsueh Chiang, Miao-Li (TW); Sz-Hsiao Chen, Miao-Li (TW)

(73) Assignee: Chimei Innolux Corporation, Miao-Li County (TW)

(*) Notice: Subject to any disclaimer, the term of this patent is extended or adjusted under 35 U.S.C. 154(b) by 939 days.

(21) Appl. No.: 12/012,846

(22) Filed: Feb. 6, 2008

(65) Prior Publication Data

US 2008/0191993 A1    Aug. 14, 2008

(30) Foreign Application Priority Data

Feb. 9, 2007 (CN) .......................... 2007 1 0073263

(51) Int. Cl.
*G11C 19/00* (2006.01)

(52) U.S. Cl. ................ 377/64; 377/78; 377/79; 377/68; 377/69; 377/81

(58) Field of Classification Search .................... 377/64, 377/68, 69, 78, 79, 81
See application file for complete search history.

(56) References Cited

U.S. PATENT DOCUMENTS

| | | | |
|---|---|---|---|
| 5,222,082 A | 6/1993 | Plus | |
| 5,289,518 A * | 2/1994 | Nakao | 377/81 |
| 5,410,583 A | 4/1995 | Weisbrod et al. | |
| 6,788,757 B1 * | 9/2004 | Lu et al. | 377/69 |
| 7,145,545 B2 * | 12/2006 | Zebedee et al. | 345/100 |
| 7,420,391 B2 * | 9/2008 | Pesci | 326/46 |
| 7,688,933 B2 * | 3/2010 | Morosawa | 377/64 |
| 7,696,972 B2 * | 4/2010 | Tseng et al. | 345/98 |
| 2009/0010379 A1 * | 1/2009 | Chiang et al. | 377/64 |

* cited by examiner

*Primary Examiner* — Tuan T Lam
(74) *Attorney, Agent, or Firm* — Altis Law Group, Inc.

(57) ABSTRACT

An exemplary shift register (20) includes a plurality of shift register units (200) connected one by one. Each of the shift register units includes a clock signal input terminal (TS), a high level signal input terminal (VH), a low level signal input terminal (VL), an input terminal (VIN), a first output terminal (VOUT1), a second output terminal (VOUT2), a first common node (P1), a second common node (P2), a first switch circuit (31), a second switch circuit (32), a third switch circuit (33), a fourth switch circuit (34), a fifth switch circuit (35), a six switch circuit (36), a nor gate, an inverter, and an and gate.

20 Claims, 7 Drawing Sheets

SHIFT REGISTER WITH LOWER POWER CONSUMPTION AND LIQUID CRYSTAL DISPLAY USING THE SAME

FIELD OF THE INVENTION

The present invention relates to shift registers, and particularly to a shift register with lower power consumption and a liquid crystal display (LCD) employing the shift register.

GENERAL BACKGROUND

An LCD has the advantages of portability, low power consumption, and low radiation. Therefore, the LCD has been widely used in various portable information products, such as notebooks, personal digital assistant (PDA), video cameras, and the like.

In general, an LCD includes a gate driver and a data driver. The gate and data drivers drive thin film transistors (TFTs) of an LCD panel of the LCD to display images. Each of the gate and data drivers includes a shift register having a plurality of shift register units connected one by one. Each of the shift register units includes an input terminal and an output terminal. The input terminal of each shift register unit is connected to the output terminal of a pre-stage shift register unit. The output terminal of each shift register unit is connected to the input terminal of a rear-stage shift register unit.

FIG. 6 is a circuit diagram of a shift register unit of a conventional shift register. The shift register unit 100 includes an input terminal (not labeled), a first clock reversed phase circuit 110, a switch circuit 120, a second clock reversed phase circuit 130, and an output terminal (not labeled).

The first clock reversed phase circuit 110 includes a first transistor M1, a second transistor M2, a third transistor M3, and a fourth transistor M4. The first to fourth transistors M1~M4 are P-channel metal-oxide-semiconductor (PMOS) transistors. A gate electrode of the first transistor M1 is the input terminal of the shift register unit 100 and is used to receive an input signal VS (i.e. an output signal of the output terminal of a pre-stage shift register unit). A source electrode of the first transistor M1 is used to receive a high level signal VDD. A drain electrode of the first transistor M1 is connected to a source electrode of the second transistor M2. A gate electrode and a drain electrode of the second transistor M2 are all used to receive a low level signal VSS. A gate electrode of the third transistor M3 and a gate electrode of the fourth transistor M4 are all used to receive a reverse clock signal CKB. A source electrode of the third transistor M3 is connected to the drain electrode of the first transistor M1. A source electrode of the fourth transistor M4 is connected to the gate electrode of the first transistor M1.

The switch circuit 120 includes a fifth transistor M5 and a sixth transistor M6. The fifth and sixth transistors M5, M6 are PMOS transistors. A gate electrode of the fifth transistor M5 is connected to a drain electrode of the third transistor M3. A source electrode of the fifth transistor M5 is used to receive the high level signal VDD. A drain electrode of the fifth transistor M5 is connected to a source electrode of the sixth transistor M6. A gate electrode of the sixth transistor M6 is connected to a drain electrode of the fourth transistor M4. A drain electrode of the sixth transistor M6 is used to receive the low level signal VSS. The source electrode of the sixth transistor M6 is the output terminal of the shift register unit 100 and is used to output an output signal VO.

The second clock reversed phase circuit 130 includes a seventh transistor M7, an eighth transistor M8, a ninth transistor M9, and a tenth transistor M10. The seventh to tenth transistors M7~M10 are PMOS transistors. A gate electrode of the seventh transistor M7 is connected to the output terminal. A source electrode of the seventh transistor M7 is used to receive the high level signal VDD. A drain electrode of the seventh transistor M7 is connected to a source electrode of the eighth transistor M8. A drain electrode and a gate electrode of the eighth transistor M8 are all used to receive the low level signal VSS. A source electrode of the ninth transistor M9 is connected to the drain electrode of the third transistor M3. A gate electrode of the ninth transistor M9 is used to receive a clock signal CK. A drain electrode of the ninth transistor M9 is connected to the drain electrode of the seventh transistor M7. A gate electrode of the tenth transistor M10 is used to receive the clock signal CK. A source electrode of the tenth transistor M10 is connected to the drain electrode of the fourth transistor M4. A drain electrode of the tenth transistor M10 is connected to the output terminal.

FIG. 7 is a sequence waveform diagram of pulse signals of the shift register unit of FIG. 5. During a first period T1, the reverse clock signal CKB is a high level, thus the third transistor M3 and the fourth transistor M4 are turned off. The clock signal CK is a low level, thus the ninth transistor M9 and the tenth transistor M10 are turned on. The output signal VO is a high level, thus the output signal VO turns off the sixth transistor M6 via the actived tenth transistor M10. The gate electrode of the eighth transistor M8 receives the low level signal VSS, thus the eighth transistor M8 is turned on. The low level signal VSS turns on the fifth transistor M5 via the actived eighth transistor M8 and the actived ninth transistor M9. The output terminal of the shift register unit 100 receives the high level signal VDD via the actived fifth transistor M5. That is, the output signal VO is high level during the first period T1.

During a second period T2, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is a low level, thus the first transistor M1 is turned on. The high level signal VDD turns off the fifth transistor M5 via the actived first transistor M1 and the actived third transistor M3. The input signal VS turns on the sixth transistor M6 via the actived fourth transistor M4. The output terminal of the shift register unit 100 receives the low level signal VSS via the actived sixth transistor M6. That is, the output signal VO is low level during the second period T2.

During a third period T3, the reversed clock signal CKB is a high level, thus the third transistor M3 and the fourth transistor M4 are turned off. The clock signal CK is a low level, thus the ninth transistor M9 and the tenth transistor M10 are turned on. The output signal VO is a low level, thus the output signal VO turns on the seventh transistor M7 and the sixth transistor M6 via the actived tenth transistor M10. The high level signal VDD turns off the fifth transistor M5 via the actived seventh transistor M7 and the actived ninth transistor M9. The output terminal of the shift register unit 100 receives the low level signal VSS via the actived sixth transistor M6. That is, the output signal VO is low level during the third period T3.

During a fourth period T4, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is high level, thus the first transistor M1 is turned off. The input signal VS turns off the sixth transistor M6 via the actived fourth transistor M4. The gate electrode of the second transistor M2 receives the low level signal VSS, thus the second transistor M2 is turned on. The low level signal VSS turns on the fifth transistor M5 via the actived second transistor M2 and the actived third transistor M3. The output terminal of the shift register unit 100 receives the high level signal VDD via the actived fifth transistor M5. That is, the output signal VO is high level during the fourth period T4.

During the first period T1, the first transistor M1 and the second transistor M2 are turned on, thus, the first transistor M1 and the second transistor M2 form a current path to conduct the high level signal VDD and the low level signal VSS. During the second period T2, the first transistor M1, the second transistor M2, the fifth transistor M5, the sixth transistor M6, the seventh transistor M7, and the eighth transistor M8 are turned on. The first transistor M1 and the second transistor M2 form a first current path to current path to conduct the high level signal VDD and the low level signal VSS. The fifth transistor M5 and the sixth transistor M6 form a second current path to conduct the high level signal VDD and the low level signal VSS. The seventh transistor M7 and the eighth transistor M8 form a third current path to conduct the high level signal VDD and the low level signal VSS. During the third period T3, the fifth transistor M5, the sixth transistor M6, the seventh transistor M7, and the eighth transistor M8 are turned on. The fifth transistor M5 and the sixth transistor M6 form a first current path to conduct the high level signal VDD and the low level signal VSS. The seventh transistor M7 and the eighth transistor M8 form a second current path to conduct the high level signal VDD and the low level signal VSS. During most of the operating time of the shift register, the high level signal VDD and the low level signal VSS are conducted. A voltage difference between the high level signal VDD and the low level signal VSS is large, a conductive resistance of a drain electrode and a source electrode of a transistor is small, thus, current flowing through the current paths is large. A power consumption of the shift register is correspondingly large. When the gate driver or the source driver of the LCD employs the shift register, a power consumption of the LCD is correspondingly large.

What is needed, therefore, is a shift register and an LCD employing the shift register that can overcome the above-described deficiencies.

SUMMARY

A shift register includes a plurality of shift register units. Each shift register unit includes: a nor gate comprising a first input terminal connected to an input terminal of the shift register unit, a second input terminal connected to a first output terminal of the shift register unit, and an output terminal; an and gate comprising a first input terminal connected to the input terminal, a second input terminal connected to the first output terminal, and an output terminal connected to a second output terminal of the shift register unit; a first switch circuit controlled by the output terminal of the nor gate and configured for providing a clock signal to a first common node of the shift register unit; a second switch circuit controlled by the output terminal of the nor gate and configured for providing a low level signal to the first common node; a third switch circuit controlled by the input terminal and the first common node and configured for providing a high level signal to a second common node of the shift register unit; a fourth switch circuit controlled by the first output terminal and the first common node and configured for providing a high level signal to the second common node; a fifth switch circuit controlled by the first common node and the first output terminal and configured for providing a low level signal to the second common node; a sixth switch circuit controlled by the first common node and the input terminal and configured for providing a low level signal to the second common node; and an inverter connected between the second common node and the first output terminal.

A shift register includes a plurality of shift register units connected one by one. Each of the shift register units includes a clock signal input terminal configured for receiving a clock signal, a high level signal input terminal configured for receiving a high level signal, a low level signal input terminal configured for receiving a low level signal, an input terminal configured for receiving an input signal, a first output terminal configured for outputting a first output signal, and a second output terminal configured for outputting a second output signal. The second output signal is low level when the clock signal is low level, the input signal is high level, and the first output signal is low level. The second output signal is high level when the clock signal is high level, the input signal is high level, and the first output signal is high level. The second output signal is low level when the clock signal is low level, the input signal is low level, and the first output signal is high level. The second output signal is low level when the clock signal is high level, the input signal is low level, and the first output signal is low level. The second output signal is low level when the clock signal is low level, the input signal is low level, and the first output signal is low level.

A liquid crystal display includes a liquid crystal panel and a driver circuit configured for driving the liquid crystal panel. The driver circuit includes a shift register. The shift register includes a plurality of shift register units. Each shift register unit includes: a nor gate comprising a first input terminal connected to an input terminal of the shift register unit, a second input terminal connected to a first output terminal of the shift register unit, and an output terminal; an and gate comprising a first input terminal connected to the input terminal, a second input terminal connected to the first output terminal, and an output terminal connected to a second output terminal of the shift register unit; a first switch circuit controlled by the output terminal of the nor gate and configured for providing a clock signal to a first common node of the shift register unit; a second switch circuit controlled by the output terminal of the nor gate and configured for providing a low level signal to the first common node; a third switch circuit controlled by the input terminal and the first common node and configured for providing a high level signal to a second common node of the shift register unit; a fourth switch circuit controlled by the first output terminal and the first common node and configured for providing a high level signal to the second common node; a fifth switch circuit controlled by the first common node and the first output terminal and configured for providing a low level signal to the second common node; a sixth switch circuit controlled by the first common node and the input terminal and configured for providing a low level signal to the second common node; and an inverter connected between the second common node and the first output terminal.

Other novel features and advantages will become more apparent from the following detailed description when taken in conjunction with the accompanying drawings.

DETAILED DESCRIPTION OF PREFERRED EMBODIMENTS

Reference will now be made to the drawings to describe the preferred and exemplary embodiments in detail.

Figure 1:
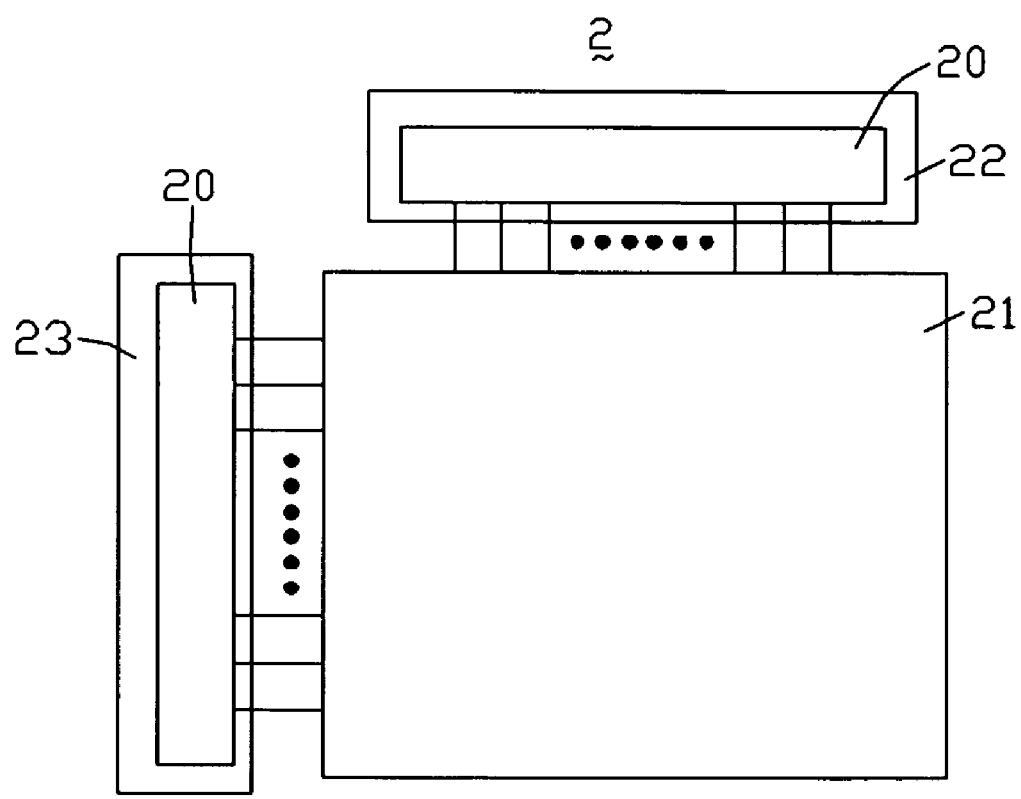
FIG. 1 is a schematic, abbreviated diagram of certain components of an LCD according to a first embodiment of the present invention, the LCD including a shift register.

FIG. 1 is a schematic, abbreviated diagram of certain components of an LCD according to a first embodiment of the present invention. The LCD 2 includes a liquid crystal panel 21, a source driver 22 connected to the liquid crystal panel 21 via a plurality of data lines (not labeled), and a gate driver 23 connected to the liquid crystal panel 21 via a plurality of gate lines (not labeled). The liquid crystal panel 21 includes a plurality of thin film transistors (TFTs). Each of the data and gate drivers 22, 23 includes a shift register 20. The shift register 20 provides shift signals to the data driver 22 or the gate driver 23. The gate driver 23 outputs high level signals or low level signals to turn on or turn off the TFTs. The data driver 23 outputs data signals to the liquid crystal panel 21 via the actived TFTs to display images.

Figure 2:
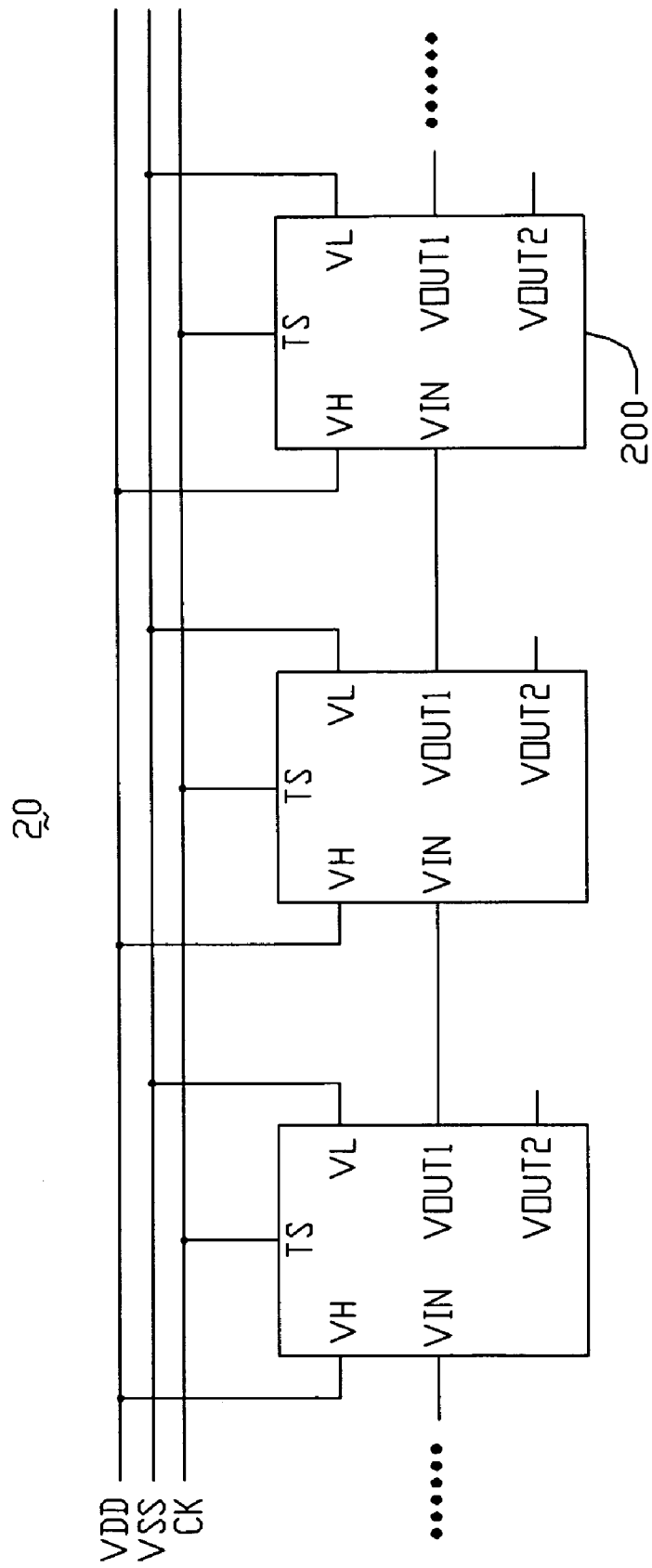
FIG. 2 is an abbreviated block circuit diagram of the shift register of FIG. 1, the shift register including a plurality of shift register units connected one by one.

FIG. 2 is an abbreviated block circuit diagram of the shift register 20 of FIG. 1. The shift register 20 includes a plurality of shift register units 200 connected one by one. All of the shift register units 200 have similar structures. Each of the shift register units 200 includes a clock signal input terminal TS for receiving a clock signal CK, a high level signal input terminal VH for receiving a high level signal VDD, a low level signal input terminal VL for receiving a low level signal VSS, an input terminal VIN, a first output terminal VOUT1, and a second output terminal VOUT2. The input terminal VIN of each shift register unit 200 is connected to the first output terminal VOUT1 of a pre-stage shift register unit. The first output terminal VOUT1 of each shift register unit 200 is connected to the input terminal VIN of a rear-stage shift register unit.

Figure 3:
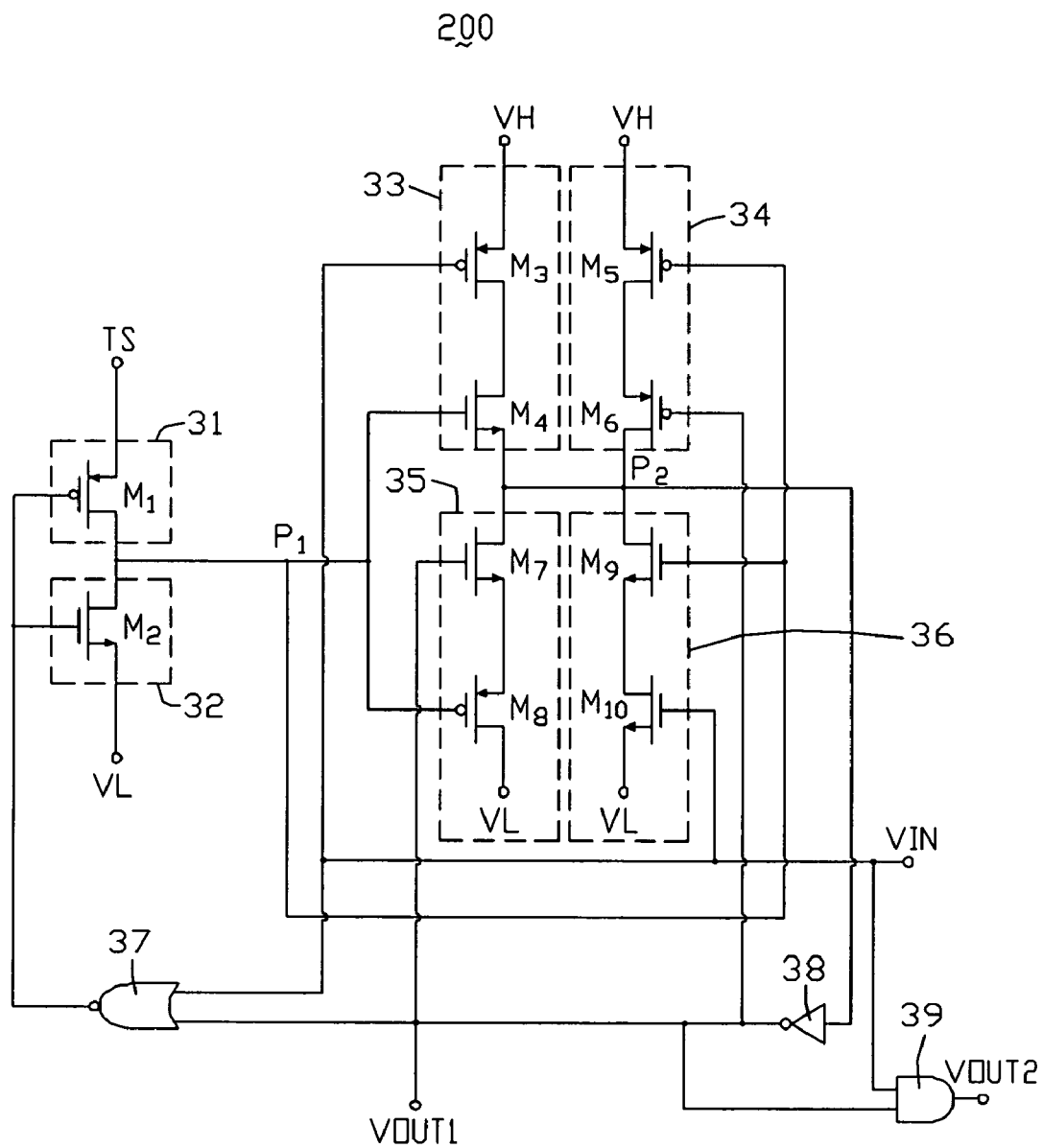
FIG. 3 is a circuit diagram of one of the shift register units of FIG. 2.

FIG. 3 is a circuit diagram of one of the shift register units 200 of FIG. 2. The shift register unit 200 includes a first switch circuit 31, a second switch circuit 32, a third switch circuit 33, a fourth switch circuit 34, a fifth switch circuit 35, a six switch circuit 36, a nor gate 37, an inverter 38, an and gate 39, a first common node P1, and a second common node P2. The nor gate 37 includes a first input terminal (not labeled), a second input terminal (not labeled), and an output terminal (not labeled). The and gate 39 includes a first input terminal (not labeled), a second input terminal (not labeled), and an output terminal (not labeled). The first input terminal of the nor gate 37 is connected to the input terminal VIN, the second input terminal of the nor gate 37 is connected to the first output terminal VOUT1. The first input terminal of the and gate 39 is connected to the input terminal VIN, and the second input terminal of the and gate 39 is connected to the first output terminal VOUT1. The inverter 38 is connected between the second common node P2 and the first output terminal VOUT1.

The first switch circuit 31 can be a first transistor M1. The first transistor M1 is a P-channel metal-oxide-semiconductor (PMOS) transistor. A gate electrode of the first transistor M1 is connected to the output terminal of the nor gate 37. A source electrode of the first transistor M1 is connected to the clock signal input terminal TS. A drain electrode of the first transistor M1 is connected to the first common node P1.

The second switch circuit 32 can be a second transistor M2. The second transistor M2 is an N-channel metal-oxide-semiconductor (NMOS) transistor. A gate electrode of the second transistor M2 is connected to the output terminal of the nor gate 37. A drain electrode of the second transistor M2 is connected to the first common node P1. A source electrode of the second transistor M2 is connected to the low level signal input terminal VL.

The third switch circuit 33 includes a third transistor M3 and a fourth transistor M4. The third transistor M3 is a PMOS transistor, and the fourth transistor M4 is an NMOS transistor. A gate electrode of the third transistor M3 is connected to the input terminal VIN. A source electrode of the third transistor M3 is connected to the high level signal input terminal VH. A drain electrode of the third transistor M3 is connected to a drain electrode of the fourth transistor M4. A gate electrode of the fourth transistor M4 is connected to the first common node P1. A source electrode of the fourth transistor M4 is connected to the second common node P2.

The fourth switch circuit 34 includes a fifth transistor M5 and a sixth transistor M6. The fifth transistor M5 and the sixth transistor M6 are PMOS transistors. A gate electrode of the fifth transistor M5 is connected to the first common node P1. A source electrode of the fifth transistor M5 is connected to the high level signal input terminal VH. A drain electrode of the fifth transistor M5 is connected to a source electrode of the sixth transistor M6. A gate electrode of the sixth transistor M6 is connected to the first output terminal VOUT1. A drain electrode of the sixth transistor M6 is connected to the second common node P2.

The fifth switch circuit 35 includes a seventh transistor M7 and an eighth transistor M8. The seventh transistor M7 is an NMOS transistor, and the eighth transistor M8 is a PMOS transistor. A gate electrode of the seventh transistor M7 is connected to the first output terminal VOUT1. A drain electrode of the seventh transistor M7 is connected to the second common node P2. A source electrode of the seventh transistor M7 is connected to a source electrode of the eighth transistor M8. A gate electrode of the eighth transistor M8 is connected to the first common node P1. A drain electrode of the eighth transistor M8 is connected to the low level signal-input terminal VL.

The sixth switch circuit 36 includes a ninth transistor M9 and a tenth transistor M10. The ninth transistor M9 and the tenth transistor M10 are NMOS transistors. A gate electrode of the ninth transistor M9 is connected to the first common node P1. A drain electrode of the ninth transistor M9 is connected to the second common node P2. A source electrode of the ninth transistor M9 is connected to a drain electrode of the tenth transistor M10. A gate electrode of the tenth transistor M10 is connected to the input terminal VIN. A source electrode of the tenth transistor M10 is connected to the low level signal input terminal VL.

Figure 4:
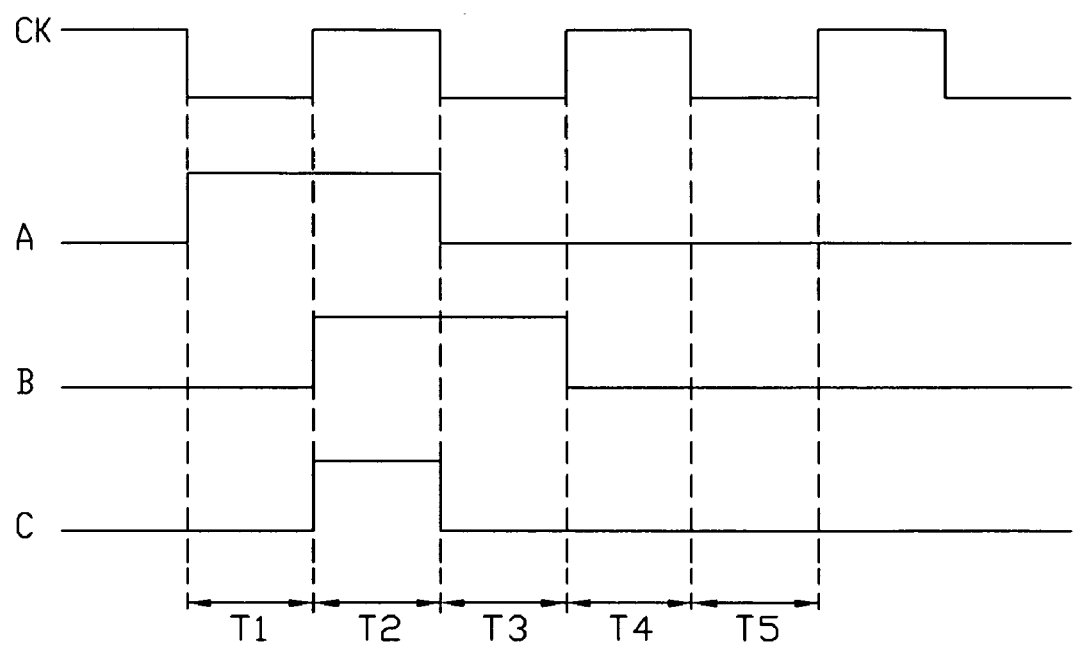
FIG. 4 is a sequence waveform diagram of pulse signals of the shift register of FIG. 2.

FIG. 4 is a sequence waveform diagram of pulse signals of the shift register of FIG. 2. A represents an input signal of the input terminal VIN of any shift register unit 200. B represents a first output signal of the first output terminal VOUT1 of the shift register unit 200. C represents a second output signal of the second output terminal VOUT2 of the shift register unit 200.

During a first period T1, the input signal A is a high level, thus the tenth transistor M10 is turned on and the third transistor M3 is turned off. The nor gate receives the input signal A and outputs a low level, signal. The first transistor M1 is turned on, the second transistor M2 is turned off. The clock signal CK is a low level, thus the first common node P1 is pulled in a low level state via the actived first transistor M1. The fourth transistor M4 is turned off, the fifth transistor M5 is turned on, the eighth transistor M8 is turned on, and the ninth transistor M9 is turned off. The first output signal B is a low level signal before the first period T1, thus the sixth transistor M6 is turned on, and the seventh transistor M7 is turned off. The inverter 38 receives the high level signal VDD via the actived fifth transistor M5 and the actived sixth transistor M6. The inverter 38 outputs a low level signal, thus the first output signal B is low level. Because the input signal A is high level and the first output signal B is low level, the and gate 39 outputs a low level signal. That is, the second output signal C is low level.

During a second period T2, the input signal A is a high level, thus the tenth transistor M10 is turned on and the third transistor M3 is turned off. The nor gate receives the input signal A and outputs a low level signal. The first transistor M1 is turned on, the second transistor M2 is turned off. The clock signal CK is a high level, thus the first common node P1 is pulled in a high level state via the actived first transistor M1. The fourth transistor M4 is turned on, the fifth transistor M5 is turned off, the eighth transistor M8 is turned off, and the ninth transistor M9 is turned on. The first output signal B is a low level signal during the first period T1, thus the sixth transistor M6 is turned on and the seventh transistor M7 is turned off. The inverter 38 receives the low level signal VSS via the actived tenth transistor M10 and the actived ninth transistor M9. The inverter 38 outputs a high level signal, thus the first output signal. B is high level. Because the input signal A is high level and the first output signal B is high level, the and gate 39 outputs a high level signal. That is, the second output signal C is high level.

During a third period T3, the input signal A is a low level, thus the tenth transistor M10 is turned off and the third transistor M3 is turned on. The nor gate receives the input signal A and the first output signal B. Because the first output signal B is a high level signal during the second period T2, the nor gate outputs a low level signal. The first transistor M1 is turned on and the second transistor M2 is turned off. The clock signal CK is a low level, thus the first common node P1 is pulled in a low level state via the actived first transistor M1. The fourth transistor M4 is turned off, the fifth transistor M5 is turned on, the eighth transistor M8 is turned on, the ninth transistor M9 is turned off, the sixth transistor M6 is turned off, and the seventh transistor M7 is turned on. The inverter 38 receives the low level signal VSS via the actived eighth transistor M8 and the actived seventh transistor M7. The inverter 38 outputs a high level signal, thus the first output signal B is high level. Because the input signal A is low level and the first output signal B is high level, the and gate 39 outputs a low level signal. That is, the second output signal C is low level.

During a fourth period T4, the input signal A is a low level, thus the tenth transistor M10 is turned off and the third transistor M3 is turned on. The nor gate receives the input signal A and the first output signal B. Because the first output signal B is a high level signal during the third period T3, the nor gate outputs a low level signal. The first transistor M1 is turned on and the second transistor M2 is turned off. The clock signal CK is a high level, thus the first common node P1 is pulled in a high level state via the actived first transistor M1. The fourth transistor M4 is turned on, the fifth transistor M5 is turned off, the eighth transistor M8 is turned off, the ninth transistor M9 is turned on, the sixth transistor M6 is turned off, and the seventh transistor M7 is turned on. The inverter 38 receives the high level signal VDD via the actived third transistor M3 and the actived fourth transistor M4. The inverter 38 outputs a low level signal, thus the first output signal B is low level. Because the input signal A is low level and the first output signal B is low level, the and gate 39 outputs a low level signal. That is, the second output signal C is low level.

During a fifth period T5, the input signal A is a low level, thus the tenth transistor M10 is turned off and the third transistor M3 is turned on. The nor gate receives the input signal A and the first output signal B. Because the first output signal B is a low level signal during the fourth period T4, the nor gate outputs a high level signal. The first transistor M1 is turned off and the second transistor M2 is turned on. The first common node P1 is pulled in a low level state via the actived second transistor M2. The fourth transistor M4 is turned off, the fifth transistor M5 is turned on, the eighth transistor M8 is turned on, the ninth transistor M9 is turned off, the sixth transistor M6 is turned on, and the seventh transistor M7 is turned off. The inverter 38 receives the high level signal VDD via the actived fifth transistor M5 and the actived sixth transistor M6. The inverter 38 outputs a low level signal, thus the first output signal B is low level. Because the input signal A is low level and the first output signal B is low level, the and gate 39 outputs a low level signal. That is, the second output signal C is low level.

During the first period T1, the fourth switch circuit is turned on. During the second period T2, the sixth switch circuit is turned on. During the third period T3, the fifth switch circuit 35 is turned on. During the fourth period T4, the third switch circuit 33 is turned on. During the fifth period T5, the fourth switch circuit 34 is turned on. In short, only one of the switch circuit 33~36 is turned on in any time. Thus, the high level signal VDD and the low level signal VSS are not conducted in any time, a power consumption of the shift register 20 correspondingly decreases. When the gate driver 23 or the source driver 22 of the LCD 2 employs the shift register 20, a power consumption of the LCD 2 correspondingly decreases.

Figure 5:
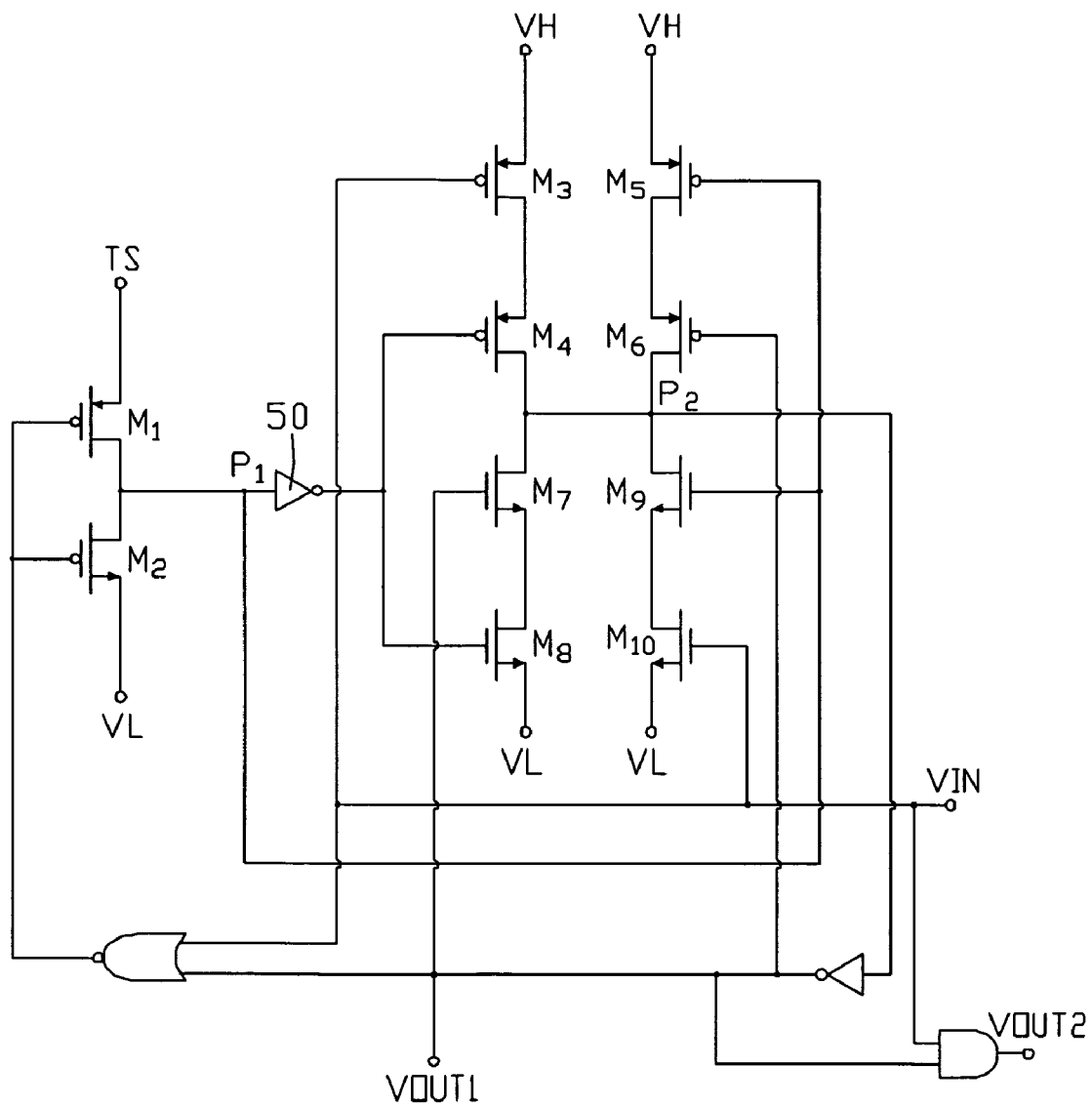
FIG. 5 is a circuit diagram of one of the shift register units of a shift register of an LCD according to a second embodiment of the present invention.
Figure 6:
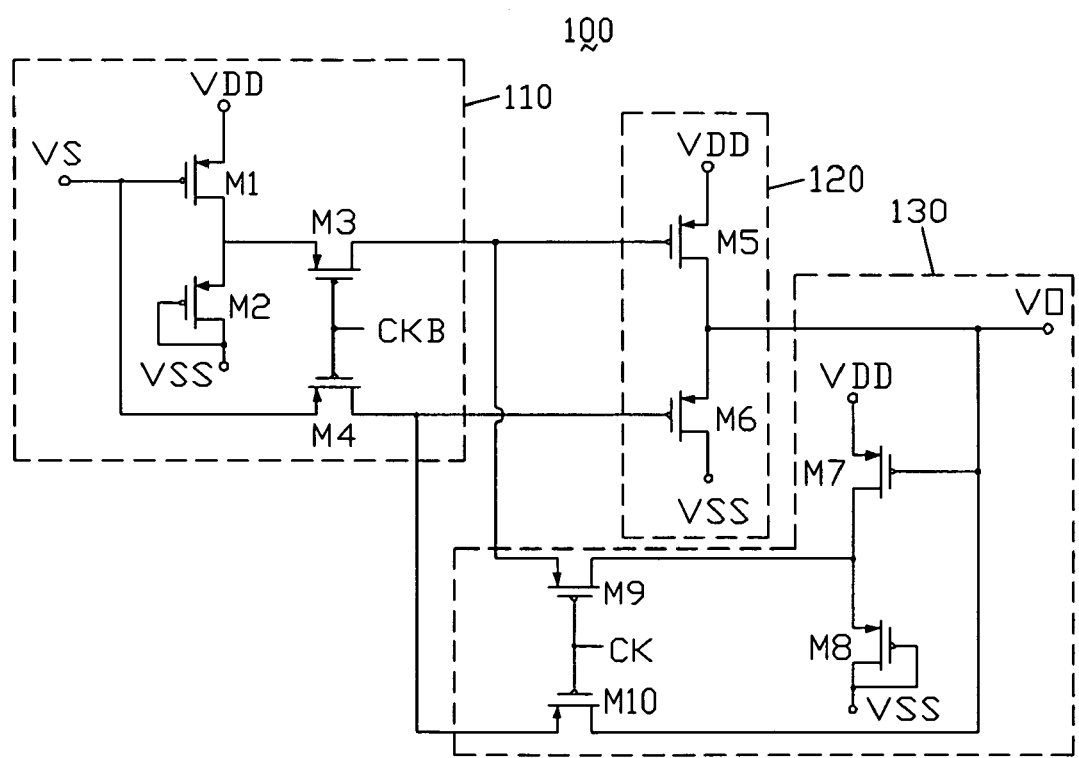
FIG. 6 is a circuit diagram of a shift register unit of a conventional shift register.
Figure 7:
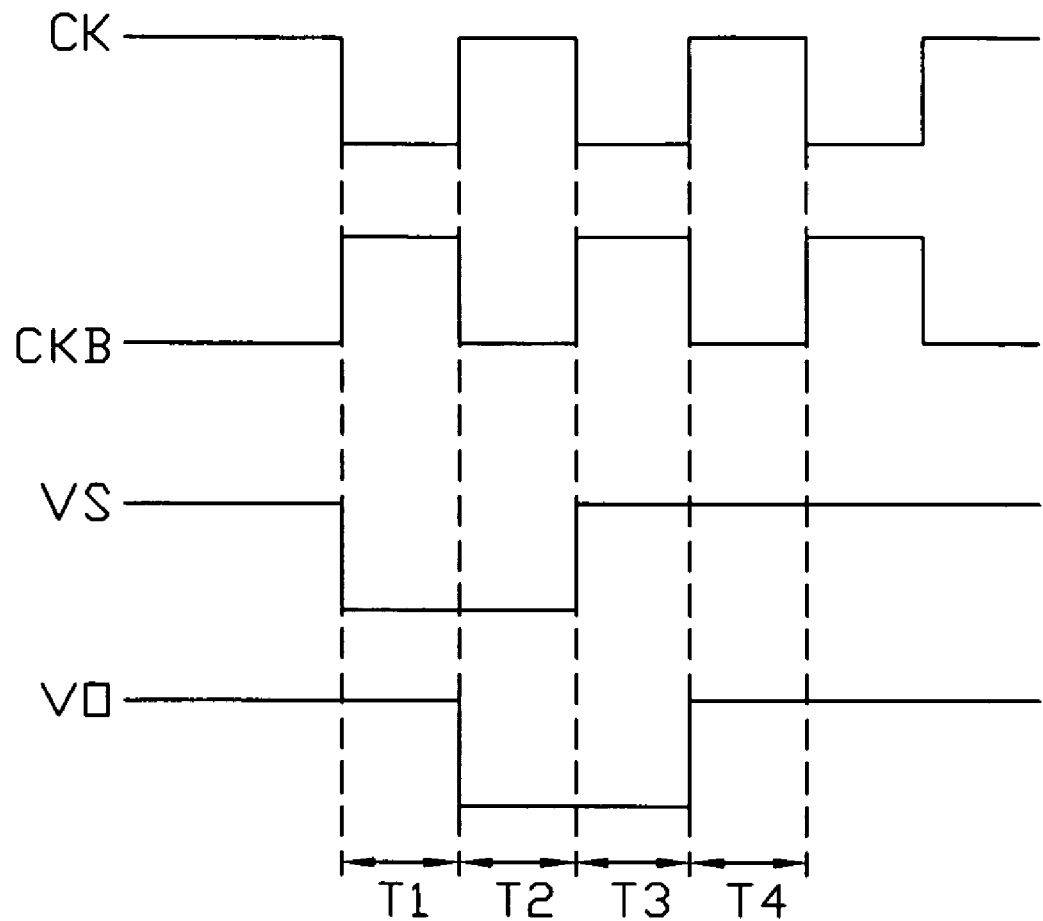
FIG. 7 is a sequence waveform diagram of pulse signals of the shift register of FIG. 6.

FIG. 5 is a circuit diagram of one of the shift register units 300 of a shift register of an LCD according to a second embodiment of the present invention. The shift register unit 300 is similar to the shift register unit 200. However, a unique characteristic of the shift register unit 300 further includes a second inverter 50. The second inverter 50 is connected between the first common node P1 and the gate electrode of the fourth transistor M4. The gate electrode of the eighth transistor M8 is connected to the second inverter 50. The fourth transistor M4 is a PMOS transistor, and the eighth transistor M8 is an NMOS transistor.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shift register, comprising a plurality of shift register units, each shift register unit comprising:

a nor gate comprising a first input terminal connected to an input terminal of the shift register unit, a second input terminal connected to a first output terminal of the shift register unit, and an output terminal;

an and gate comprising a first input terminal connected to the input terminal, a second input terminal connected to the first output terminal, and an output terminal connected to a second output terminal of the shift register unit;

a first switch circuit controlled by the output terminal of the nor gate and configured for providing a clock signal to a first common node of the shift register unit;

a second switch circuit controlled by the output terminal of the nor gate and configured for providing a low level signal to the first common node;

a third switch circuit controlled by the input terminal and the first common node and configured for providing a high level signal to a second common node of the shift register unit;

a fourth switch circuit controlled by the first output terminal and the first common node and configured for providing a high level signal to the second common node;

a fifth switch circuit controlled by the first common node and the first output terminal and configured for providing a low level signal to the second common node;

a sixth switch circuit controlled by the first common node and the input terminal and configured for providing a low level signal to the second common node; and an inverter connected between the second common node and the first output terminal.

2. The shift register as claimed in claim 1, further comprising a clock signal input terminal configured for receiving the clock signal, a high level signal input terminal configured for receiving the high level signal, and a low level signal input terminal configured for receiving the low level signal.

3. The shift register as claimed in claim 2, wherein the first switch circuit is a transistor, a gate electrode of the transistor is connected to the output terminal of the nor gate, a source electrode of the transistor is connected to the clock signal input terminal, a drain electrode of the transistor is connected to the first common node.

4. The shift register as claimed in claim 3, wherein the transistor is a P-channel metal-oxide-semiconductor transistor.

5. The shift register as claimed in claim 2, wherein the second switch circuit is a transistor, a gate electrode of the transistor is connected to the output terminal of the nor gate, a source electrode of the transistor is connected to the low level signal input terminal, a drain electrode of the transistor is connected to the first common node.

6. The shift register as claimed in claim 5, wherein the transistor is an N-channel metal-oxide-semiconductor transistor.

7. The shift register as claimed in claim 2, wherein the third switch circuit comprises a first transistor and a second transistor, a gate electrode of the first transistor is connected to the input terminal, a source electrode of the first transistor is connected to the high level signal input terminal, a drain electrode of the first transistor is connected to a drain electrode of the second transistor, a gate electrode of the second transistor is connected to the first common node, a source electrode of the second transistor is connected to the second common node.

8. The shift register as claimed in claim 7, wherein the first transistor is a P-channel metal-oxide-semiconductor transistor, and the second transistor is an N-channel metal-oxide-semiconductor transistor.

9. The shift register as claimed in claim 8, further comprising a second inverter wherein the second inverter is connected between the first common node and the gate electrode of the second transistor.

10. The shift register as claimed in claim 9, wherein the first transistor and the second transistor are P-channel metal-oxide-semiconductor transistors.

11. The shift register as claimed in claim 2, wherein the fourth switch circuit comprises a first transistor and a second transistor, a gate electrode of the first transistor is connected to the first common node, a source electrode of the first transistor is connected to the high level signal input terminal, a drain electrode of the first transistor is connected to a source electrode of the second transistor, a gate electrode of the second transistor is connected to the first output terminal, a drain electrode of the second transistor is connected to the second common node.

12. The shift register as claimed in claim 11, wherein the first transistor and the second transistor are P-channel metal-oxide-semiconductor transistors.

13. The shift register as claimed in claim 2, wherein the fifth switch circuit comprises a first transistor and a second transistor, a gate electrode of the first transistor is connected to the first output terminal, a drain electrode of the first transistor is connected to the second common node, a source electrode of the first transistor is connected to a source electrode of the second transistor, a gate electrode of the second transistor is connected to the first common node, a drain electrode of the second transistor is connected to the low level signal input terminal.

14. The shift register as claimed in claim 13, wherein the first transistor is an N-channel metal-oxide-semiconductor transistor, and the second transistor is a P-channel metal-oxide-semiconductor transistor.

15. The shift register as claimed in claim 13, further comprising a second inverter, wherein the second inverter is connected between the first common node and the gate electrode of the second transistor.

16. The shift register as claimed in claim 15, wherein the first transistor and the second transistor are N-channel metal-oxide-semiconductor transistors.

17. The shift register as claimed in claim 2, wherein the sixth switch circuit comprises a first transistor and a second transistor, a gate electrode of the first transistor is connected to the first common node, a drain electrode of the first transistor is connected to the second common node, a source electrode of the first transistor is connected to a drain electrode of the second transistor, a gate electrode of the second transistor is connected to the input terminal, a source electrode of the second transistor is connected to the low level signal input terminal.

18. The shift register as claimed in claim 17, wherein the first transistor and the second transistor are N-channel metal-oxide-semiconductor transistors.

19. A shift register, comprising a plurality of shift register units connected one by one, each of the shift register units comprising a clock signal input terminal configured for receiving a clock signal, a high level signal input terminal configured for receiving a high level signal, a low level signal input terminal configured for receiving a low level signal, an input terminal configured for receiving an input signal, a first output terminal configured for outputting a first output signal, and a second output terminal configured for outputting a second output signal;

wherein the second output signal is low level when the clock signal is low level, the input signal is high level, and the first output signal is low level;

the second output signal is high level when the clock signal is high level, the input signal is high level, and the first output signal is high level;

the second output signal is low level when the clock signal is low level, the input signal is low level, and the first output signal is high level;

the second output signal is low level when the clock signal is high level, the input signal is low level, and the first output signal is low level; and the second output signal is low level when the clock signal is low level, the input signal is low level, and the first output signal is low level.

20. A liquid crystal display, comprising a liquid crystal panel and a driver circuit configured for driving the liquid crystal panel; the driver circuit comprising a shift register; the shift register comprising a plurality of shift register units, each shift register unit comprising:

a nor gate comprising a first input terminal connected to an input terminal of the shift register unit, a second input terminal connected to a first output terminal of the shift register unit, and an output terminal;

an and gate comprising a first input terminal connected to the input terminal, a second input terminal connected to the first output terminal, and an output terminal connected to a second output terminal of the shift register unit;

a first switch circuit controlled by the output terminal of the nor gate and configured for providing a clock signal to a first common node of the shift register unit;

a second switch circuit controlled by the output terminal of the nor gate and configured for providing a low level signal to the first common node;

a third switch circuit controlled by the input terminal and the first common node and configured for providing a high level signal to a second common node of the shift register unit;

a fourth switch circuit controlled by the first output terminal and the first common node and configured for providing a high level signal to the second common node;

a fifth switch circuit controlled by the first common node and the first output terminal and configured for providing a low level signal to the second common node;

a sixth switch circuit controlled by the first common node and the input terminal and configured for providing a low level signal to the second common node; and an inverter connected between the second common node and the first output terminal.

* * * * *